United States Patent
Mao et al.

(10) Patent No.: US 9,011,093 B2
(45) Date of Patent: Apr. 21, 2015

(54) FAN HOLDER AND FAN FASTENING STRUCTURE FOR FASTENING A FAN

(75) Inventors: Zhong-hui Mao, New Taipei (TW); Te-Hsiung Hsieh, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 461 days.

(21) Appl. No.: 13/350,833

(22) Filed: Jan. 16, 2012

(65) Prior Publication Data

US 2012/0219427 A1    Aug. 30, 2012

(30) Foreign Application Priority Data

Feb. 28, 2011    (CN) .......................... 2011 1 0047515

(51) Int. Cl.
*F04D 29/00*    (2006.01)
*G06F 1/20*    (2006.01)
*H05K 7/20*    (2006.01)
*G06F 1/18*    (2006.01)

(52) U.S. Cl.
CPC ............ *H05K 7/20172* (2013.01); *G06F 1/183* (2013.01); *G06F 1/20* (2013.01)

(58) Field of Classification Search
CPC ..... F01D 25/24; F01D 25/28; H05K 7/20172; G06F 1/20
USPC ..................... 415/213.1, 214.1, 119; 361/695
See application file for complete search history.

(56) References Cited

U.S. PATENT DOCUMENTS

| 6,031,719 | A  | * | 2/2000 | Schmitt et al. | 361/695 |
| 6,585,486 | B2 | * | 7/2003 | Birdsell et al. | 415/213.1 |
| 6,826,048 | B1 | * | 11/2004 | Dean et al. | 361/695 |
| 6,865,078 | B1 | * | 3/2005 | Chang | 361/695 |
| 7,758,308 | B2 | * | 7/2010 | Wu et al. | 415/214.1 |
| 8,045,328 | B1 | * | 10/2011 | Chen | 361/695 |
| 2009/0147466 | A1 | * | 6/2009 | Lu | 361/679.48 |
| 2009/0147473 | A1 | * | 6/2009 | Yi | 361/695 |
| 2010/0053895 | A1 | * | 3/2010 | Sun | 361/697 |
| 2010/0107397 | A1 | * | 5/2010 | Letourneau | 29/453 |

FOREIGN PATENT DOCUMENTS

| CN | 2809713 Y | 8/2006 |
| CN | 201531464 U | 7/2010 |
| TW | 318896 U | * 9/2007 |

OTHER PUBLICATIONS

Office action mailed on May 28, 2014 for the China application No. 201110047515.3, p. 3 line 5-26.

* cited by examiner

*Primary Examiner* — Edward Look
*Assistant Examiner* — Jesse Prager
(74) *Attorney, Agent, or Firm* — Winston Hsu; Scott Margo (57) ABSTRACT

A fan holder for holding a fan is disclosed. The fan holder includes a frame for containing the fan, at least one hook for hooking the fan when the fan is contained inside the frame, at least one resilient arm connected to the frame for resiliently contacting the fan base when the frame is installed inside a fan base, and at least one resilient clip connected to at least one lateral side of the frame for wedging inside a slot formed between the fan base and a casing when the frame is installed inside the fan base.

7 Claims, 12 Drawing Sheets

FAN HOLDER AND FAN FASTENING STRUCTURE FOR FASTENING A FAN

BACKGROUND OF THE INVENTION

1. Field of the Invention

The present invention relates to a fan holder and a fan fastening structure, and more particularly, to a fan holder and a fan fastening structure capable of diminishing vibration generated by a fan.

2. Description of the Prior Art

With development of technology, consumer electronics are equipped with more and more functions carrying out higher and higher performance. However, high performance results in high power consumption, and moreover, it causes issues of resonance, noise, heat dissipation and so on. For example, more heat is generated when components with high performances are functioning. If heat generated from inner components of an electronic product can not be dissipated efficiently, it will affect stability and efficiency of the electronic product or cause the electronic product to be out of order. A conventional solution to cool the component down is to install a heat dissipating device, such as a fan device, on the component where the heat is generated, so as to make the electronic product function well. Since the fan is consumable, it would be best to fix the fan simply, conveniently and without using tools. Nevertheless, a conventional way to fix the fan by screw causes complexity for assembly as well as cost enhancement. Moreover, vibration generated by the fan when functioning will be transmitted to other components through screws. As a result, it may diminish service life of other components (e.g. a hard disk drive) in long-term use, so as to reduce stability of the system. It becomes an important issue for the fan fastening structure to be low cost, easily assembled and capable of diminishing the vibration generated by the fan when functioning.

SUMMARY OF THE INVENTION

The present invention provides a fan holder and a fan fastening structure capable of diminishing vibration generated by a fan for solving the above drawbacks.

According to the claimed invention, a fan holder for holding a fan includes a frame for containing the fan, at least one hook connected to the frame for hooking the fan when the fan is installed inside the frame, at least one resilient arm connected to the frame for resiliently contacting a fan base when the frame is installed inside the fan base, and at least one resilient clip connected to at least one lateral side of the frame for wedging inside a slot formed between the fan base and a casing when the frame is installed inside the fan base.

According to the claimed invention, the fan holder further includes a rigid holding portion disposed on a side of the frame, a resilient holding portion disposed on the side and facing the rigid holding portion of the frame, and an engaging portion connected to the resilient holding portion for engaging inside a groove on the fan base, so as to fix the frame inside the fan base, wherein the rigid holding portion and the resilient holding portion are cooperatively used to be a force-applying position for holding the frame, and the resilient holding portion is used for driving the engaging portion to separate from the groove on the fan base.

According to the claimed invention, the rigid holding portion includes a first arc-shaped hole, and the resilient holding portion includes a second arc-shaped hole and a ring-shaped protruding structure disposed inside the second arc-shaped hole.

According to the claimed invention, the fan holder further includes at least one pin disposed on an inner side of the frame for inserting into a hole of the fan, so as to fix the fan inside the frame.

According to the claimed invention, the fan holder further includes at least one abutting portion connected to the frame for abutting against the fan when the fan is installed inside the frame.

According to the claimed invention, the fan holder further includes a cable routing structure disposed on the frame for routing a cable of the fan, and a fan connector socket disposed at an end of the cable routing structure for containing a fan connector of the fan.

According to the claimed invention, a fan holding structure for holding a fan includes a casing, a fan base installed on the casing, at least one slot being formed between the fan base and the casing, and a fan holder installed inside the fan base. The fan holder includes a frame for containing the fan, at least one hook connected to the frame for hooking the fan when the fan is installed inside the frame, at least one resilient arm connected to the frame for resiliently contacting the fan base when the frame is installed inside the fan base, and at least one resilient clip connected to at least one lateral side of the frame for wedging inside the at least one slot formed between the fan base and a casing when the frame is installed inside the fan base.

According to the claimed invention, at least one hook is disposed on the casing, and at least one hooking structure is formed on the fan base for engaging with the at least one hook on the casing, so as to hang the fan base on the casing.

According to the claimed invention, at least one opening is formed on the casing, at least one spring arm is disposed on the fan base, and a protrusion is formed at an end of the at least one spring arm for engaging inside the opening on the casing.

According to the claimed invention, the fan base includes a host connector socket for containing a host connector.

In summary, the fan holding structure of the present invention does not require any tools when assembling, and it only needs draw and plug operation when the fan is disassembled. Furthermore, the present invention can effectively diminish the vibration generated by the fan when functioning due to tight fit design among components, so as to achieve effect of vibration reduction. As a result, the present invention provides the fan holding structure with low cost, easy assembly, and the capable of diminishing the vibration generated by the fan when functioning.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
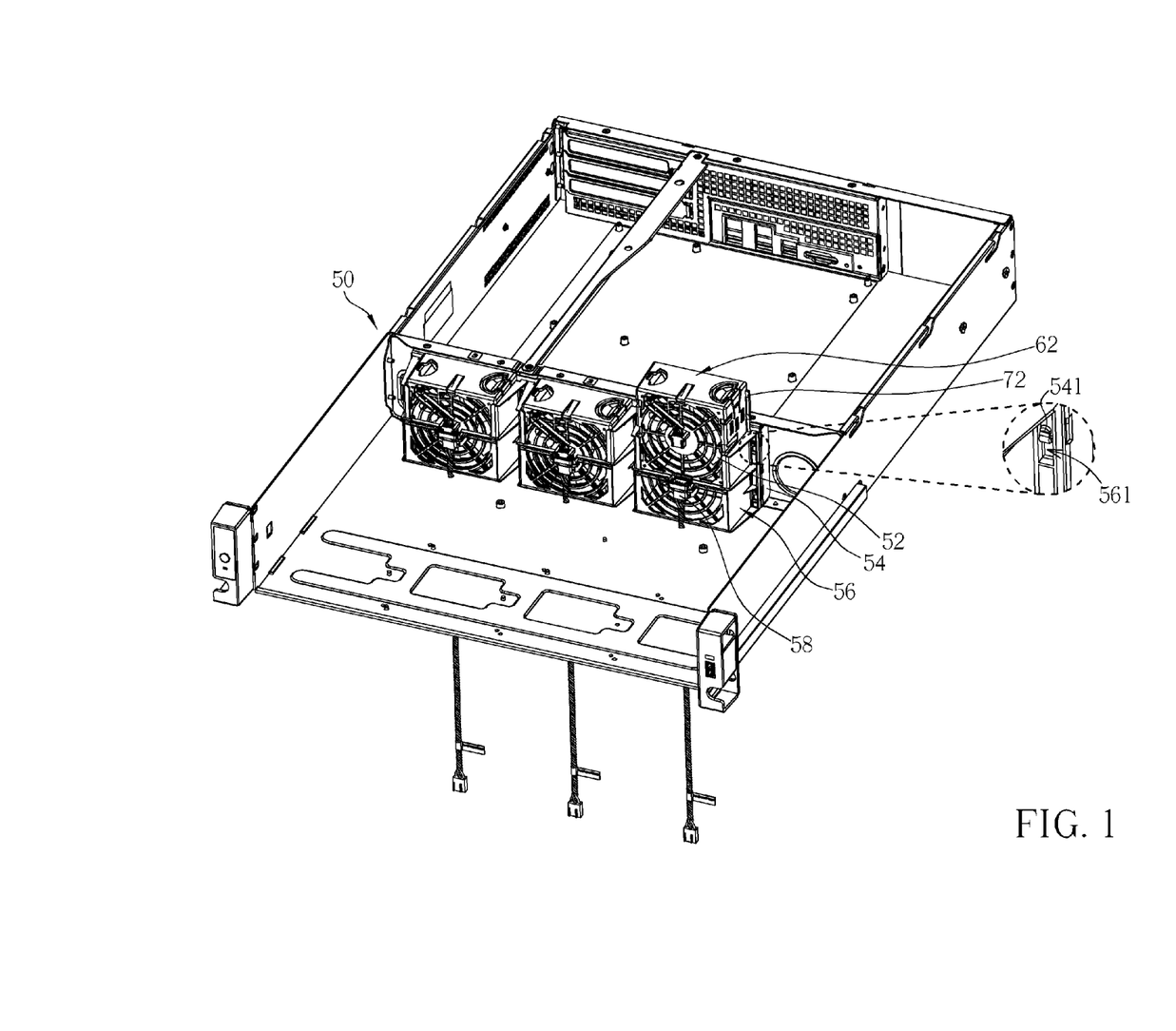
FIG. 1 to FIG. 3 are respectively an assembly diagram and a diagram of components of a fan holding structure according to an embodiment of the present invention.
Figure 2:
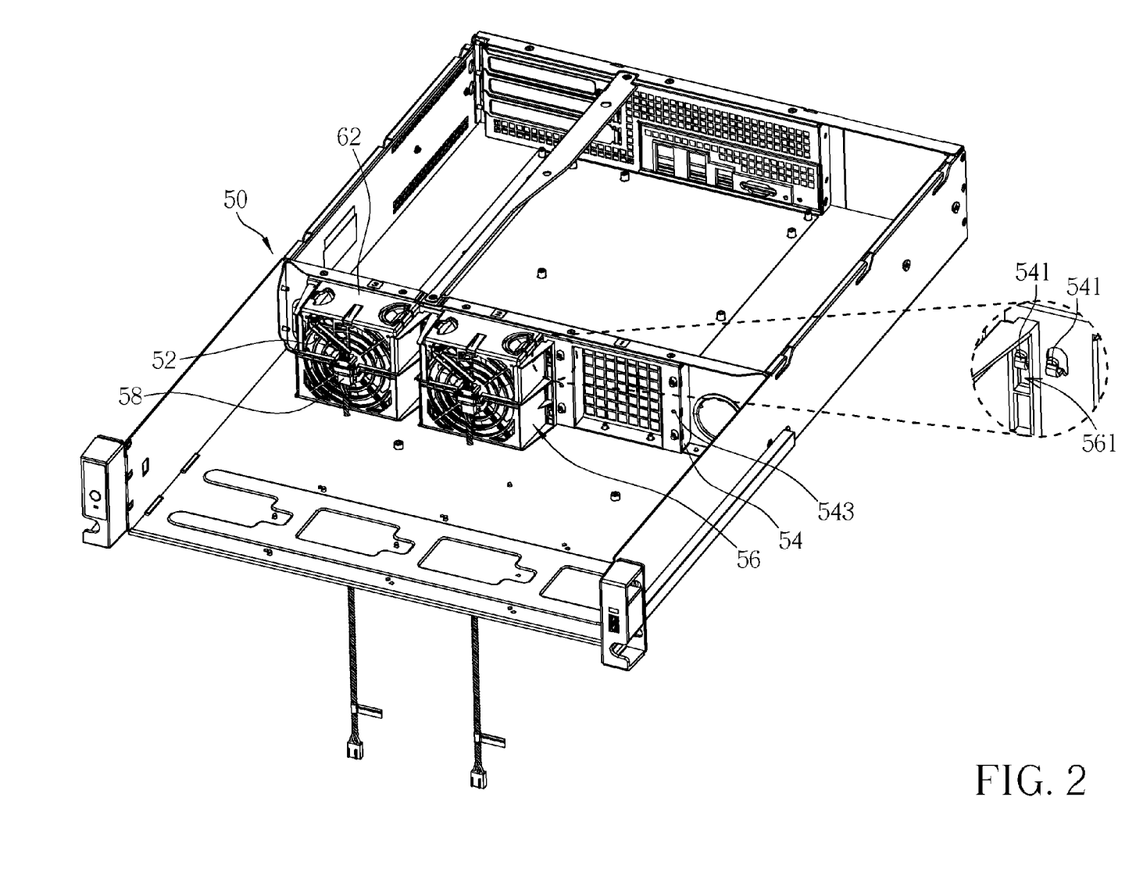
Figure 3:
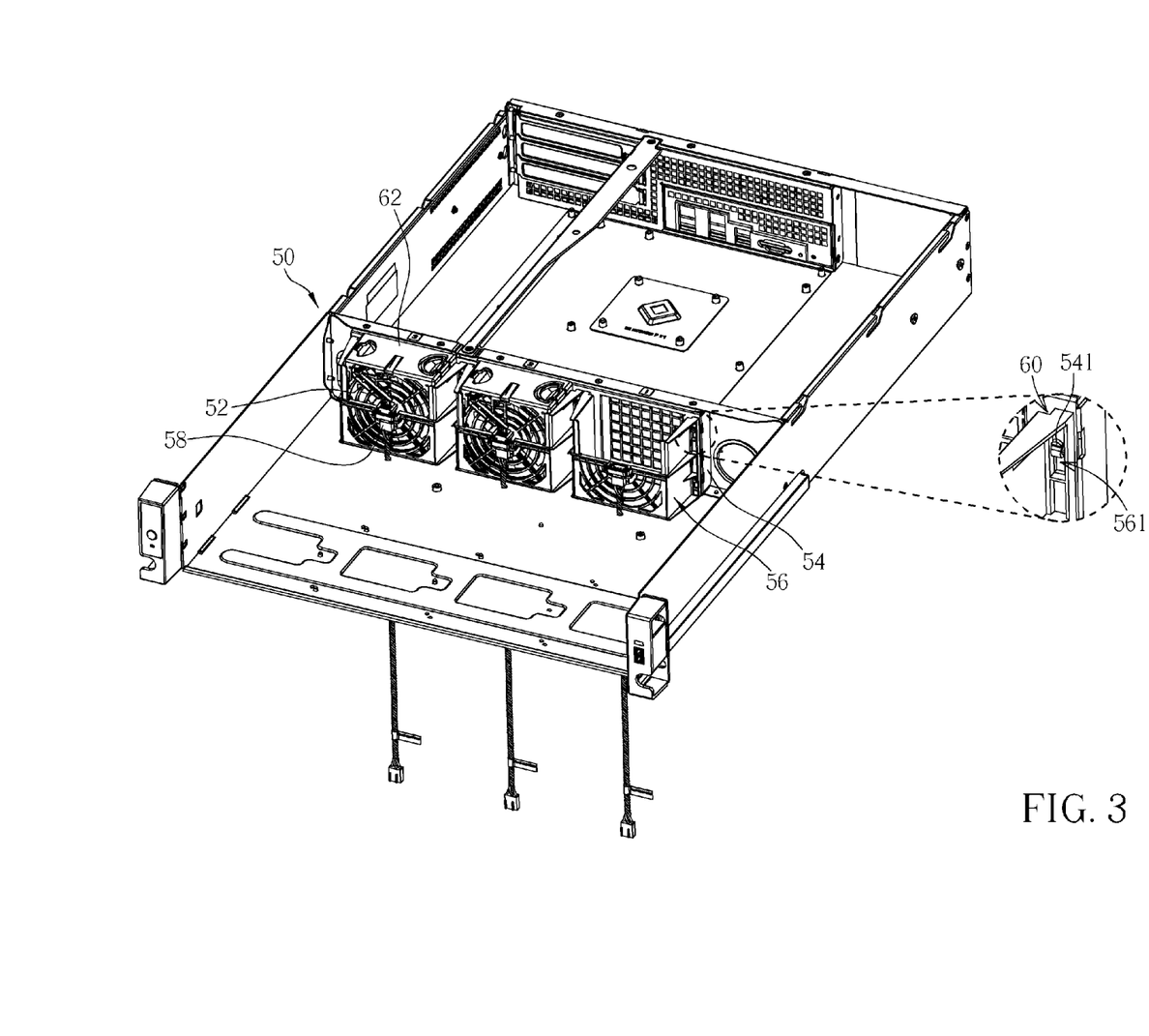
Figure 4:
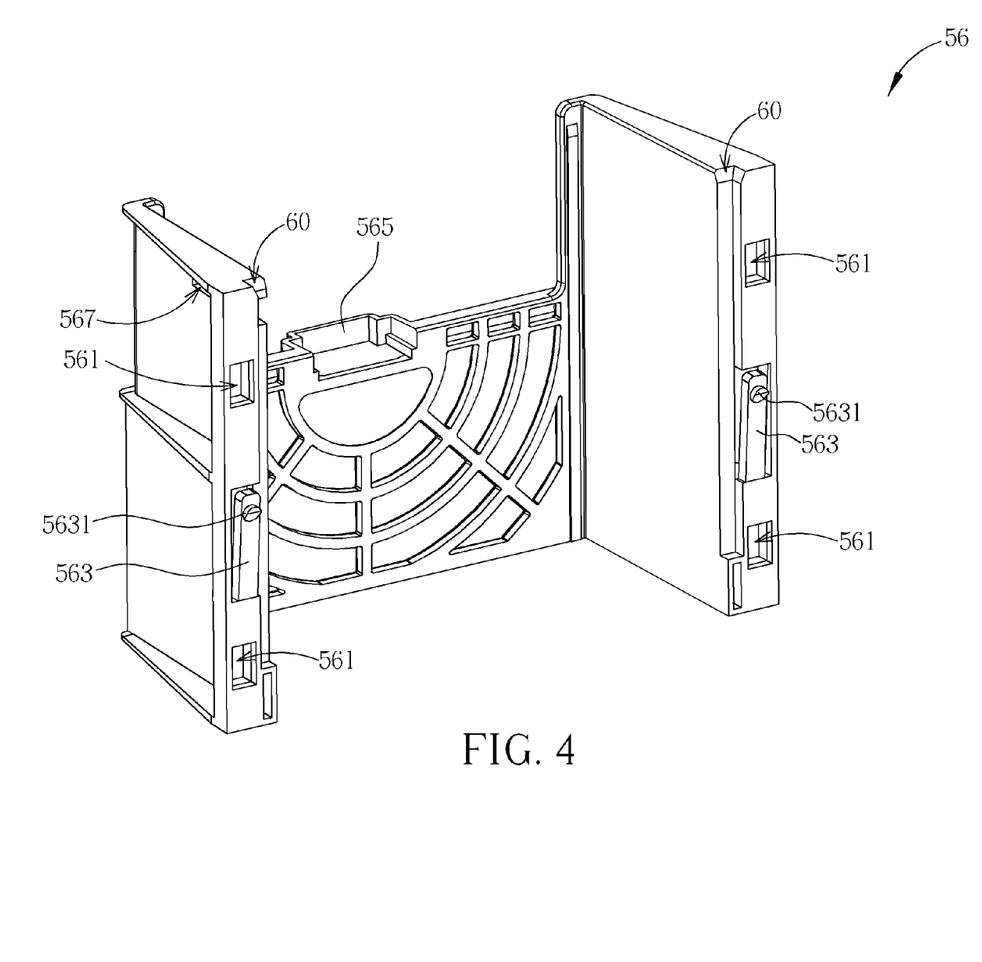
FIG. 4 is a diagram of a fan base according to the embodiment of the present invention.

Please refer to FIG. 1 to FIG. 3. FIG. 1 to FIG. 3 are respectively an assembly diagram and a diagram of components of a fan holding structure 50 according to an embodiment of the present invention. The fan holding structure 50 is installed inside a computer system for holding a fan 52. The fan 52 is used for dissipating heat generated by internal components and can be an axial-flow fan, a centrifugal fan and so on. The fan holding structure 50 includes a casing 54 whereon at least one hook 541 is disposed and at least one opening 543 is formed. The fan holding structure 50 further includes at least one fan base 56 installed on the casing 54. The present invention can include a plurality of the fan bases 56 or a single fan base 56 for supporting a corresponding amount of the fans 52. At least one hooking structure 561 is formed on the fan base 56 for engaging with the at least one hook 541 on the casing 54, so as to hang the fan base 56 on the casing 54. Please refer to FIG. 1 to FIG. 4. FIG. 4 is a diagram of the fan base 56 according to the embodiment of the present invention. At least one spring arm 563 is formed on the fan base 56, and a protrusion 5631 is formed at an end of each spring arm 563 for engaging inside the opening 543 on the casing 54. When the fan base 56 is hung on the casing 54, the spring arm 563 tightly abuts against the casing 54 and the protrusion 5631 of the spring arm 563 tightly engages inside the opening 543 on the casing 54. In such a manner, the spring arm 563 can not only constrain the fan base 56 from moving upwards and downwards, but also tightly combine the fan base 56 and the casing 54, so as to achieve vibration reduction. In addition, the fan base 56 includes a host connector socket 565 for containing a host connector 58. Furthermore, at least one step structure can be formed on the fan base 56, so that at least one slot 60 is formed between the fan base 56 and the casing 54.

Figure 5:
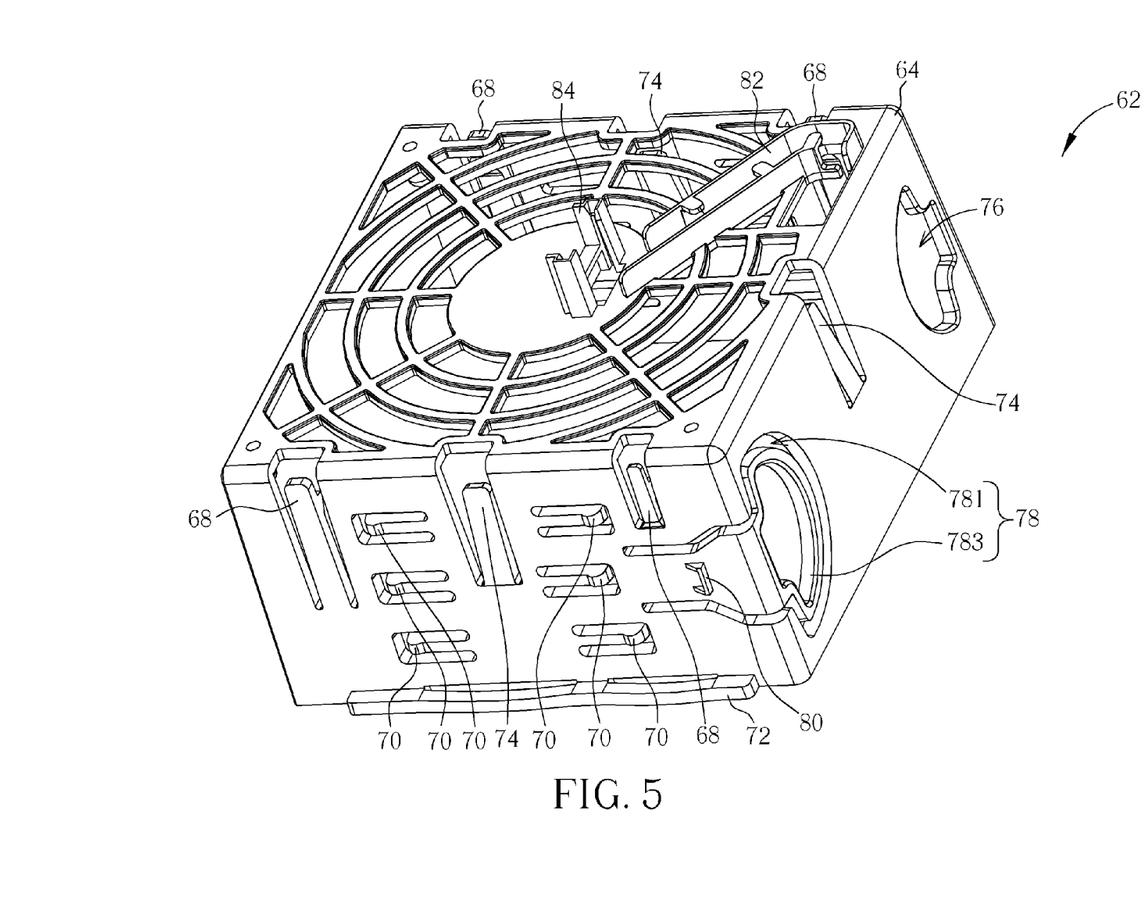
FIG. 5 and FIG. 6 are respectively diagrams of a fan holder in different views according to the embodiment of the present invention.
Figure 6:
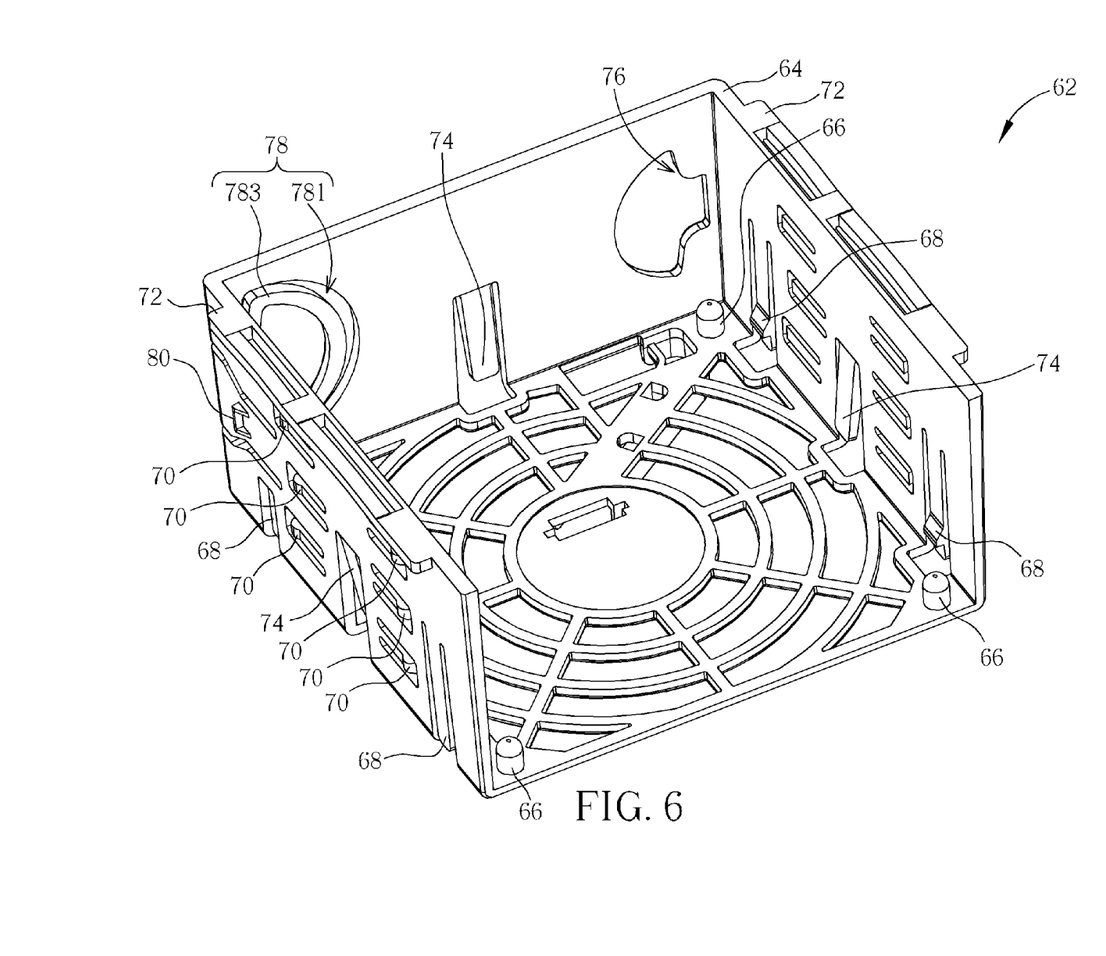
Figure 7:
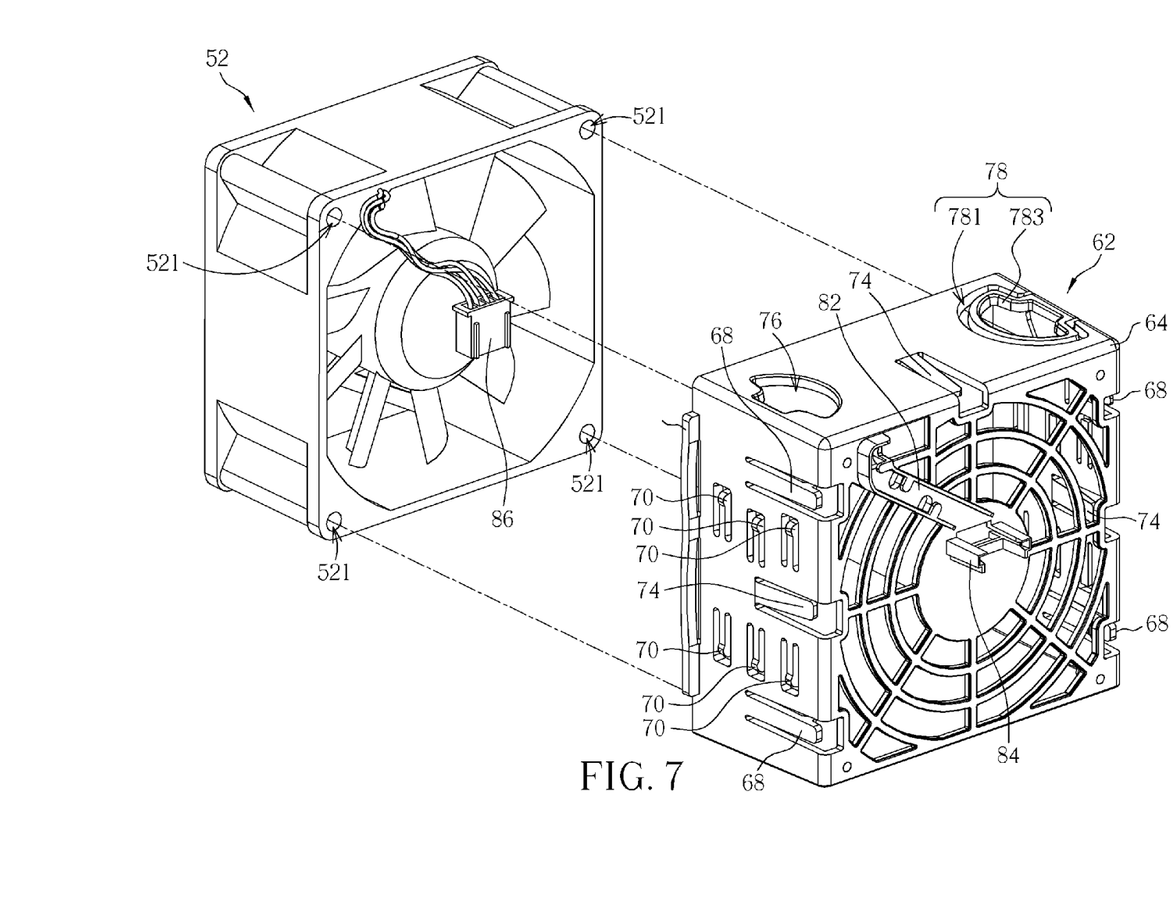
FIG. 7 is an exploded diagram of the fan holder and a fan according to the embodiment of the present invention.
Figure 8:
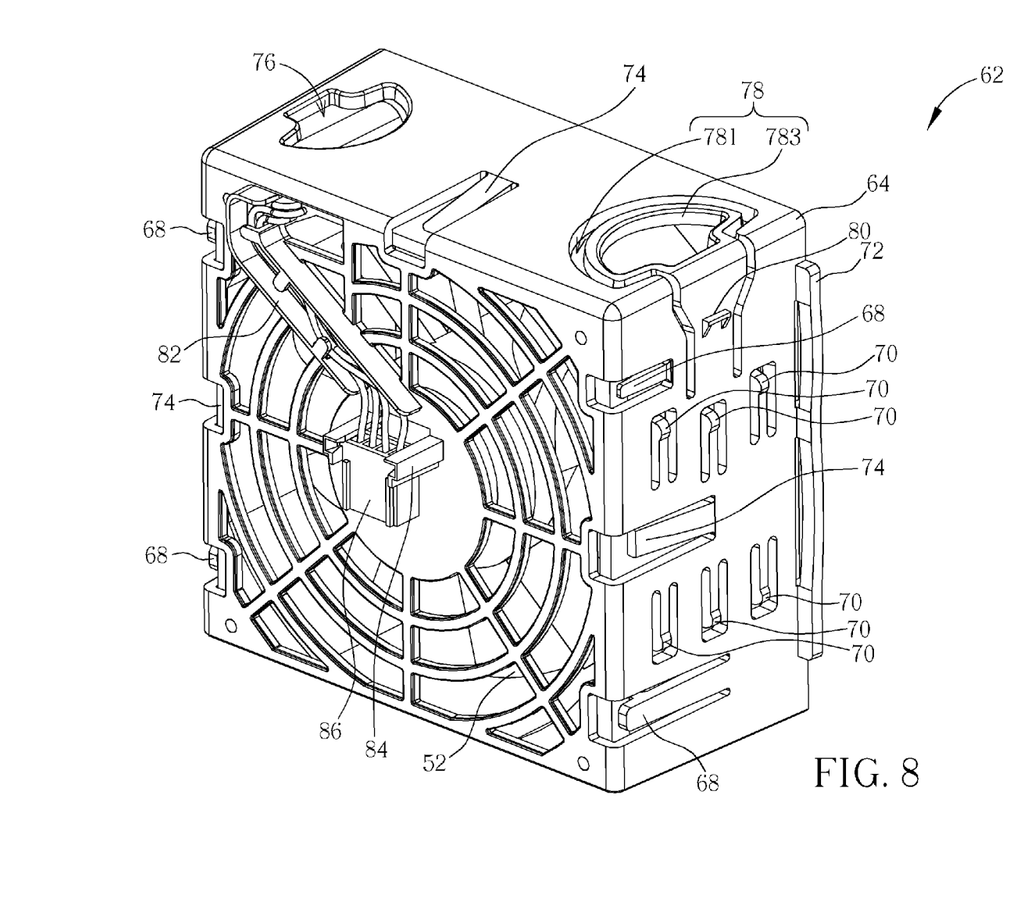
FIG. 8 and FIG. 9 are respectively diagrams illustrating the fan being installed inside the fan holder in different views according to the embodiment of the present invention.
Figure 9:
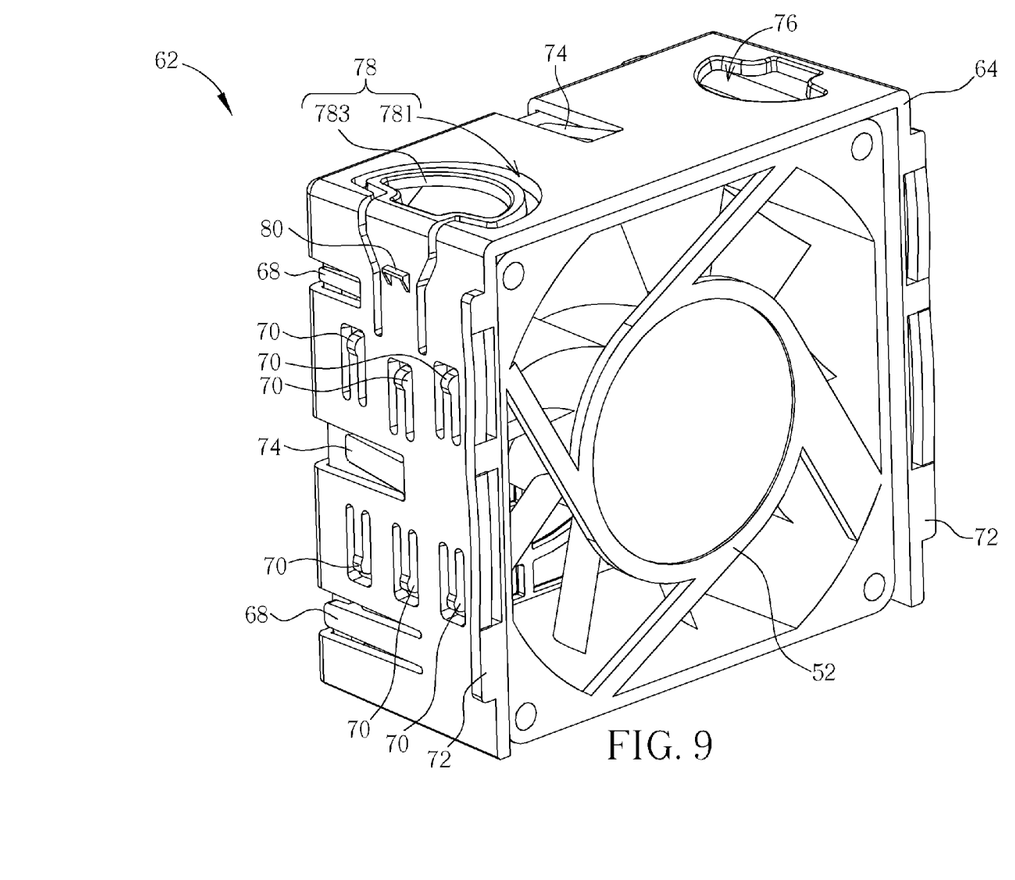
Figure 10:
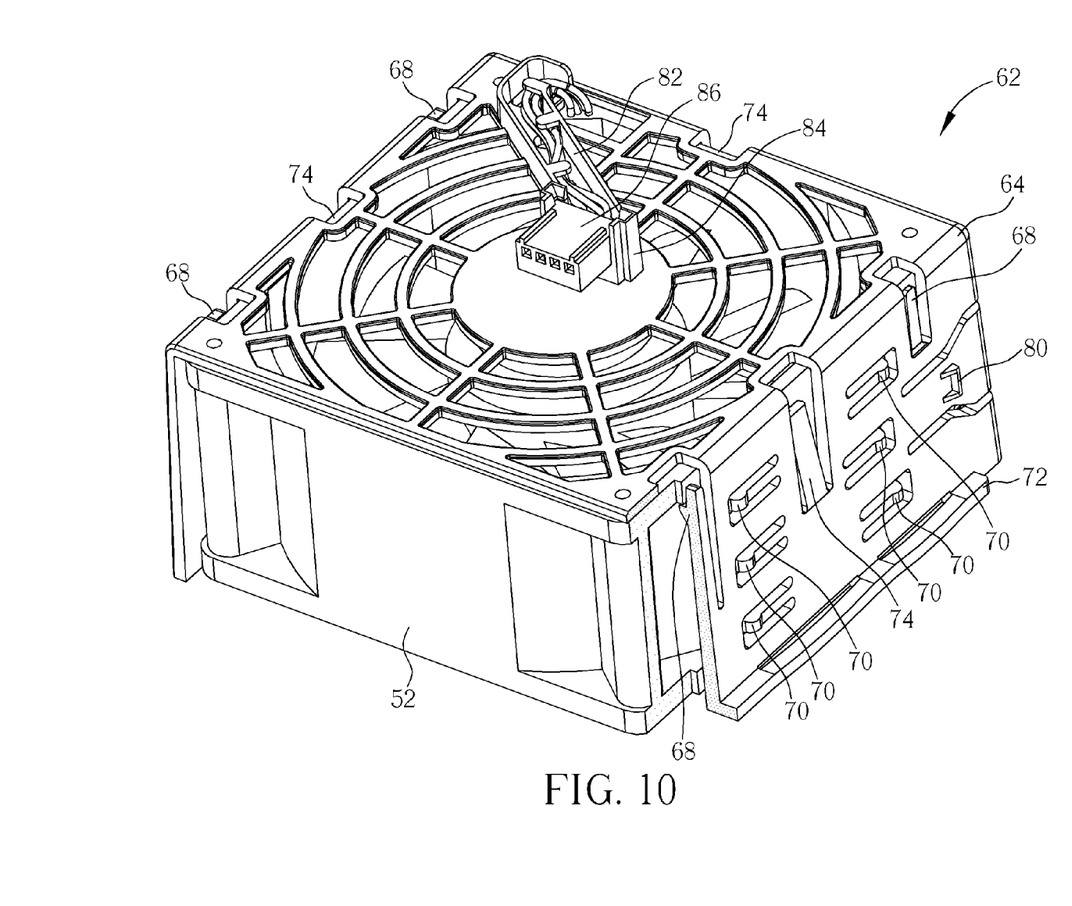
FIG. 10 is a partly sectional view illustrating a hook engaging the fan according to the embodiment of the present invention.

Furthermore, the fan holding structure 50 further includes a fan holder 62 installed inside the fan base 56. Please refer to FIG. 5 to FIG. 9. FIG. 5 and FIG. 6 are respectively diagrams of the fan holder 62 in different views according to the embodiment of the present invention. FIG. 7 is an exploded diagram of the fan holder 62 and the fan 52 according to the embodiment of the present invention. FIG. 8 and FIG. 9 are respectively diagrams illustrating the fan 52 being installed inside the fan holder 62 in different views according to the embodiment of the present invention. The fan holder 62 includes a frame 64 for containing the fan 52. The fan holder 62 further includes at least one pin 66 disposed on an inner side of the frame 64 for inserting into at least one hole 521 of the fan 52, so as to fix the fan 52 inside the frame 64. The fan holder 62 further includes at least one hook 68 connected to a lateral side of the frame 64. Please refer to FIG. 10. FIG. 10 is a partly sectional view illustrating the hook 68 engaging the fan 52 according to the embodiment of the present invention. The hook 68 is used for hooking a rim of the fan 52 when the fan 52 is installed inside the frame 64, so as to prevent the fan 52 from dropping out from the frame 64. In this embodiment, the fan holder 62 includes four hooks 68, wherein the two hooks 68 are respectively formed on the opposite sides of the frame 64. The amount and the position of the hooks 68 are not limited to the above-mentioned embodiment, and it depends on practical demands.

Figure 11:
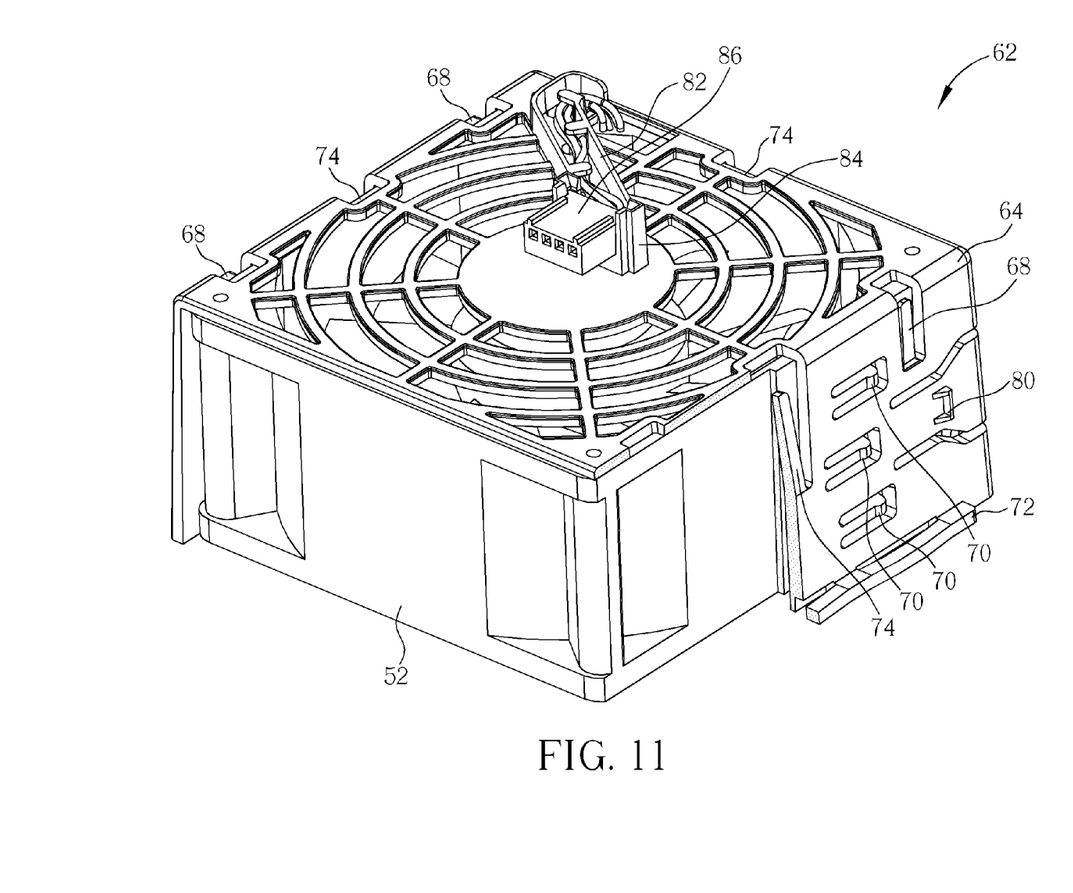
FIG. 11 is a partly sectional view illustrating an abutting portion abutting against the fan according to the embodiment of the present invention.

The fan holder 62 further includes at least one resilient arm 70 connected to the lateral side of the frame 64 for resiliently contacting the fan base 56 when the frame 64 is installed inside the fan base 56. Accordingly, vibration generated by the fan 52 when functioning is transmitted to the fan base 56 via the frame 64 and the resilient arm 70. In this embodiment, the three resilient arms 70 are respectively formed on the opposite sides of the frame 64. The amount and the position of the resilient arms 70 are not limited to the above-mentioned embodiment, and it depends on practical demands. In addition, the fan holder 62 further includes at least one resilient clip 72 which can be a resilient arch-shaped structure. The at least one resilient clip 72 is connected to at least one lateral side of the frame 64 for wedging inside the at least one slot 60 formed between the fan base 56 and the casing 54 when the frame 64 is installed inside the fan base 56. Since the resilient clip 72 is tightly wedged inside the slot 60, the vibration generated by the fan 52 when functioning can be transmitted from the fan base 56 to the casing 54 via the resilient clip 72. In this embodiment, two sets of the resilient clips 72 are respectively disposed on the opposite lateral sides of the frame 64. The amount and the position of the resilient clips 72 are not limited to the above-mentioned embodiment, and it depends on practical demands. In addition, the fan holder 62 further includes at least one abutting portion 74 connected to a lateral side of the frame 64. Please refer to FIG. 11. FIG. 11 is a partly sectional view illustrating the abutting portion 74 abutting against the fan 52 according to the embodiment of the present invention. The abutting portion 74 is used for abutting against the fan 52 when the fan 52 is installed inside the frame 64, so as to transmit the vibration generated by the fan 52 when functioning to the frame 64. In this embodiment, three sets of the abutting portions 74 are respectively disposed on the three lateral sides of the frame 64. The amount and the position of the abutting portions 74 are not limited to the above-mentioned embodiment, and it depends on practical demands.

Figure 12:
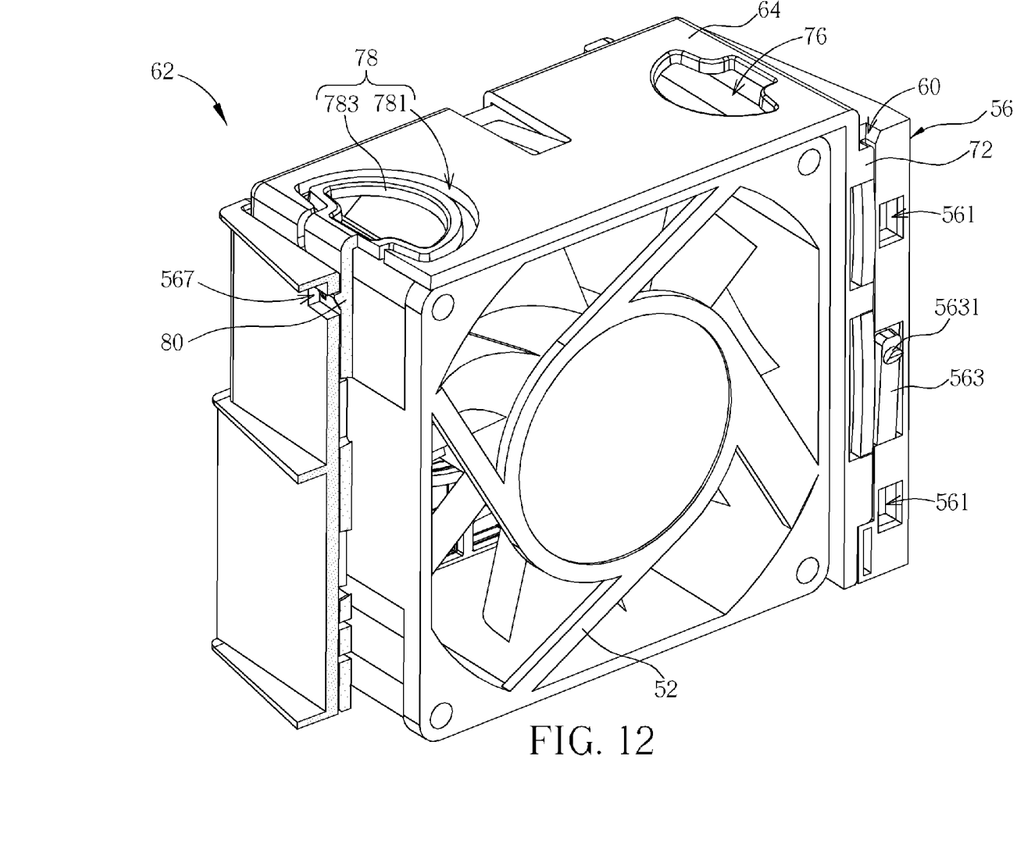
FIG. 12 is a partly sectional view illustrating an engaging portion engaging the fan base according to the embodiment of the present invention.

The fan holder 62 further includes a rigid holding portion 76 disposed on a side of the frame 64, a resilient holding portion 78 disposed on the side and facing the rigid holding portion 76 of the frame 64, and an engaging portion 80 connected to the resilient holding portion 78. Please refer to FIG. 12. FIG. 12 is a partly sectional view illustrating the engaging portion 80 engaging the fan base 56 according to the embodiment of the present invention. The engaging portion 80 can be a hook structure. The engaging portion 80 is used for engaging inside a groove 567 on the fan base 56, so as to constrain the frame 64 from moving upward relative to the fan base 56. Accordingly, the frame 64 can be fixed inside the fan base 56. The rigid holding portion 76 and the resilient holding portion 78 are cooperatively used to be a force-applying position for holding the frame 64. For example, the rigid holding portion 76 can be a first arc-shaped hole, and the resilient holding portion 78 includes a second arc-shaped hole 781 and a ring-shaped protruding structure 783 disposed inside the second arc-shaped hole 781. A side of the first arc-shaped hole and the ring-shaped protruding structure 783 can be abutted by a user's finger, and the ring-shaped protruding structure 783 is pushed inwardly. In such a manner, the resilient holding portion 78 can drive the engaging portion 80 to separate from the groove 567 of the fan base 56. Accordingly, the fan holder 62 can be disassembled from the fan base 56. The fan holder 62 further include a cable routing structure 82 disposed on the frame 64 for routing a cable of the fan 52, so as to prevent the cable from being drawn into the fan 52. The fan holder 62 further includes a fan connector socket 84 disposed at an end of the cable routing structure 82 for containing a fan connector 86 of the fan 52, wherein the fan connector 86 is used for connecting the host connector 58 so as to transmit signals between the fan 52 and the main board.

The fan base 56 and the fan holder 62 of the present invention can be made of plastic material. With elasticity of the plastic material, the pin 66, the hook 68 and the abutting portion 74 on the frame 64 can tightly fix the fan 52 inside the fan holder 62. The resilient arm 70 on the frame 64 can tightly fix the fan holder 62 inside the fan base 56. The resilient clip 72 and the engaging portion 80 on the frame 64 can tightly fix the fan holder 62 inside the fan base 56 and the casing 54. In summary, the present invention can effectively reduce the vibration generated by the fan 52 so as to achieve effect of the vibration reduction.

Compared with the prior art, the fan holding structure of the present invention does not require any tools when assembling, and it only needs draw and plug operation when the fan is disassembled. Furthermore, the present invention can effectively diminish the vibration generated by the fan when functioning due to tight fit design among components, so as to achieve effect of the vibration reduction. As a result, the present invention provides the fan holding structure with low cost, easy assembly, and the capable of diminishing the vibration generated by the fan when functioning.

Those skilled in the art will readily observe that numerous modifications and alterations of the device and method may be made while retaining the teachings of the invention.

What is claimed is:

1. A fan holding structure for holding a fan, comprising:
    a casing whereon at least one opening is formed, at least one hook being disposed on the casing;
    a fan base installed on the casing, at least one slot being formed between the fan base and the casing, at least one spring arm being disposed on the fan base, a protrusion being formed at an end of the at least one spring arm, the at least one spring arm tightly abutting against the casing and not penetrating through the casing, the protrusion tightly engaging inside the at least one opening on the casing when the fan base is hung on the casing, and at least one hooking structure being formed on the fan base for engaging with the at least one hook on the casing, so as to hang the fan base on the casing; and
    a fan holder installed inside the fan base, comprising:
        a frame for containing the fan;
        at least one hook connected to the frame for hooking the fan when the fan is installed inside the frame;
        at least one resilient arm connected to the frame for resiliently contacting the fan base when the frame is installed inside the fan base; and
        at least one resilient clip connected to at least one lateral side of the frame for wedging inside the at least one slot formed between the fan base and the casing when the frame is installed inside the fan base.

2. The fan holding structure of claim 1, wherein the fan holder further comprises:
    a rigid holding portion disposed on a side of the frame;
    a resilient holding portion disposed on the side and facing the rigid holding portion of the frame; and
    an engaging portion connected to the resilient holding portion for engaging inside a groove on the fan base, so as to fix the frame inside the fan base;
    wherein the rigid holding portion and the resilient holding portion are cooperatively used to be a force-applying position for holding the frame, and the resilient holding portion is used for driving the engaging portion to separate from the groove on the fan base.

3. The fan holding structure of claim 2, wherein the fan holder further comprises a first arc-shaped hole, and the resilient holding portion comprises a second arc-shaped hole and a ring-shaped protruding structure disposed inside the second arc-shaped hole.

4. The fan holding structure of claim 1, wherein the fan holder further comprises at least one pin disposed on an inner side of the frame for inserting into a hole of the fan, so as to fix the fan inside the frame.

5. The fan holding structure of claim 1, wherein the fan holder further comprises at least one abutting portion connected to the frame for abutting against the fan when the fan is installed inside the frame.

6. The fan holding structure of claim 1, wherein the fan holder further comprises:
    a cable routing structure disposed on the frame for routing a cable of the fan; and
    a fan connector socket disposed at an end of the cable routing structure for containing a fan connector of the fan.

7. The fan holding structure of claim 1, wherein the fan base comprises
    a host connector socket for containing a host connector.

* * * * *